United States Patent [19]

Noda et al.

[11] Patent Number: 4,460,108
[45] Date of Patent: Jul. 17, 1984

[54] APPARATUS FOR FEEDING ELECTRIC CIRCUIT ELEMENTS

[75] Inventors: Teruyoshi Noda; Iwao Ichikawa, both of Tokyo, Japan

[73] Assignee: Sony Corporation, Tokyo, Japan

[21] Appl. No.: 377,987

[22] Filed: May 13, 1982

Related U.S. Application Data

[63] Continuation of Ser. No. 145,719, May 1, 1980, abandoned.

[30] Foreign Application Priority Data

May 12, 1979 [JP] Japan .................................. 54-58199

[51] Int. Cl.³ ............................................... B65H 3/32
[52] U.S. Cl. .................................... 221/94; 221/181;
221/197; 221/296; 221/298
[58] Field of Search ................................. 221/93–95,
221/112, 175, 178, 179, 181, 197, 252, 254, 296,
298, 299; 29/809

[56] References Cited

U.S. PATENT DOCUMENTS

| | | | |
|---|---|---|---|
| 1,515,697 | 11/1924 | Pope | 221/94 |
| 1,682,911 | 9/1928 | Jorgensen | 221/93 X |
| 1,944,360 | 1/1934 | Meyer | 221/254 X |
| 2,507,185 | 5/1950 | Schneider | 221/181 X |
| 3,527,383 | 9/1970 | Borsum et al. | 221/112 |

FOREIGN PATENT DOCUMENTS 602270  7/1978  Switzerland .......................... 221/197

*Primary Examiner*—F. J. Bartuska
*Attorney, Agent, or Firm*—Lewis H. Eslinger; Alvin Sinderbrand

[57] ABSTRACT

Apparatus for feeding electric circuit elements includes a plurality of containers or stockers for electric circuit elements, a transfer member connected to a respective stocker for transferring the circuit elements, and a shutter assembly disposed across the feeding path of the transfer member, whereby a plurality of circuit elements are fed at one time by one stroke of the shutter assembly. The shutter assembly may have a cut-out portion at the edge thereof and is adjustably removable in a direction perpendicular to that of the stroke thereof to open the feeding paths which correspond to the cut-out portion. The stocker may include a receptacle, the bottom of which defines an opening to receive a capture member. The capture member has plural through holes extending axially therethrough and is opened at its conical top thereof to receive circuit elements by reciprocal movement of the capture member relative to the receptacle.

9 Claims, 15 Drawing Figures

F I G.10
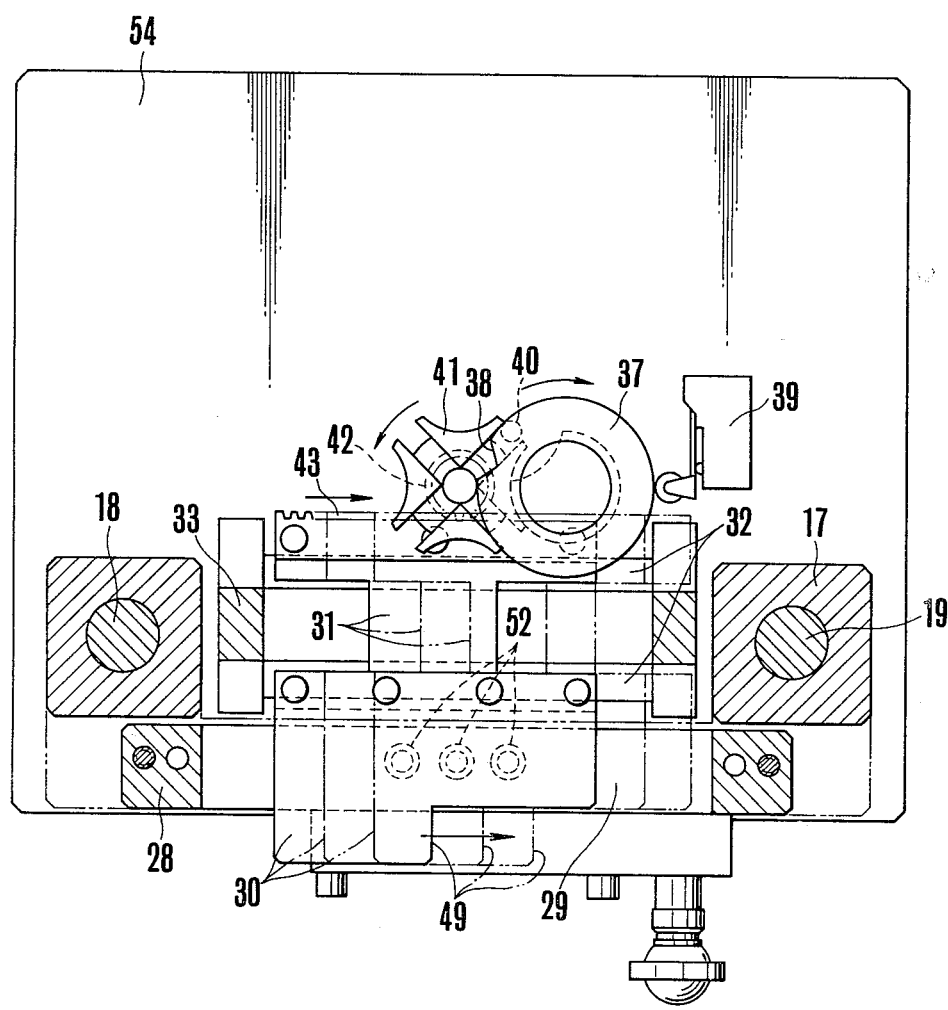

APPARATUS FOR FEEDING ELECTRIC CIRCUIT ELEMENTS

This is a continuation, of application Ser. No. 145,719 filed May 1, 1980 now abandoned.

BACKGROUND OF THE INVENTION

1. Field of the Invention

This invention generally relates to an apparatus for feeding electric circuit elements or electrical parts. More particularly, the invention is directed to, but not limited to, an apparatus for feeding chip type circuit elements for manufacturing a hybrid integrated circuit.

2. Description of the Prior Art

Hybrid integrated circuits are well known and have various circuit elements constructed in the form of chips. These chip-type circuit elements are mounted on a circuit board and are connected electrically by means of a conductive pattern on the circuit board.

It is costly and time consuming to assemble these types of hybrid circuits by mounting the chip type circuit elements manually one by one. Thus automated equipment such as vibration type parts feeders have been used as an automatic parts feeding apparatus to feed chip-type circuit elements. Using this type of parts feeder, however, poses various problems due to the high level of vibration and noise incident with such equipment. In addition, the parts may be damaged due to the vibration and the collisions caused thereby and may be contaminated because they are transferred by vibration.

Another method to assemble hybrid integrated circuits used heretofore is to automatically feed the chip-type electric circuit parts through a transfer passage or path by dropping the chips so that they fall freely by propelling the chips by pneumatic pressure. This type of system, however, requires shutters for controlling the feeding of the chips which are disposed in respective passages and results in a complicated structure which inherently raises the costs of the feeding apparatus. such an apparatus is even more complicated when a plurality of parts of the same kind are taken out of a common hopper.

SUMMARY OF THE INVENTION

It is, therefore, an object of the present invention to provide an automatic feeding apparatus for feeding chip-type electric circuit elements or parts for assembly in a hybrid integrated circuit with a minimum of direct manual labor.

It is another object of the present invention to provide an automatic feeding apparatus for feeding chip-type electric circuit parts which has a relatively simplified construction particularly in the shutter mechanism.

It is still another object of the present invention to provide an automatic feeding apparatus for feeding chip-type electric circuit parts without contaminating the chip-type electric circuit parts.

It is a further object of the present invention to provide an automatic feeding apparatus for feeding chip-type electric circuit parts which is free from the problems of vibration and noise common to some prior art assembly devices.

It is a still further object of the present invention to provide an automatic feeding apparatus for feeding chip-type electric circuit parts wherein the apparatus is capable of permitting an easy replacement of parts in compliance with a demand for parts change.

According to one aspect of the present invention, there is provided an apparatus for automatically feeding electric circuit elements such as chip-type circuit elements comprising a plurality of stockers for electric circuit elements, transfer members connected to respective stockers wherein the transfer members are adapted for transferring the circuit elements, and shutter means disposed across the transfer path of the transfer members, whereby a plurality of the electric circuit elements are fed at one time by a single stroke of the shutter means.

The above and other objects, features and advantages of the invention will be apparent from the following detailed description of illustrative embodiments thereof which is to be read in connection with the accompanying drawings.

BRIEF DESCRIPTION OF THE DRAWINGS

FIG. 10 is a sectional view similar to that in FIG. 8 showing the apparatus during the operating state after completion of the shifting of the shutter position;

DETAILED DESCRIPTION OF THE PREFERRED EMBODIMENTS

In a preferred embodiment of the present invention circuit elements for use in hybrid integrated circuits are fed by the apparatus for assembly on a printed circuit board. In this production system, small sized chip-type circuit elements or parts are fed from a circuit element feeding apparatus and are disposed in predetermined positions on a template. Then, a printed circuit board which has an adhesive resin applied thereto is superposed on the template carrying the electric circuit elements so that the elements are transferred to the printed circuit board by adhesion to the adhesive resin. Subsequently, light and heat are applied to the printed circuit board to harden the adhesive resin to temporarily hold the electric circuit elements. Finally, the cap-shaped leads or electrodes at both ends of the chip-type part are electrically connected to the conductive pattern on the printed circuit board by means of solder thereby to complete the formation of the hybrid integrated circuit.

Figure 1:
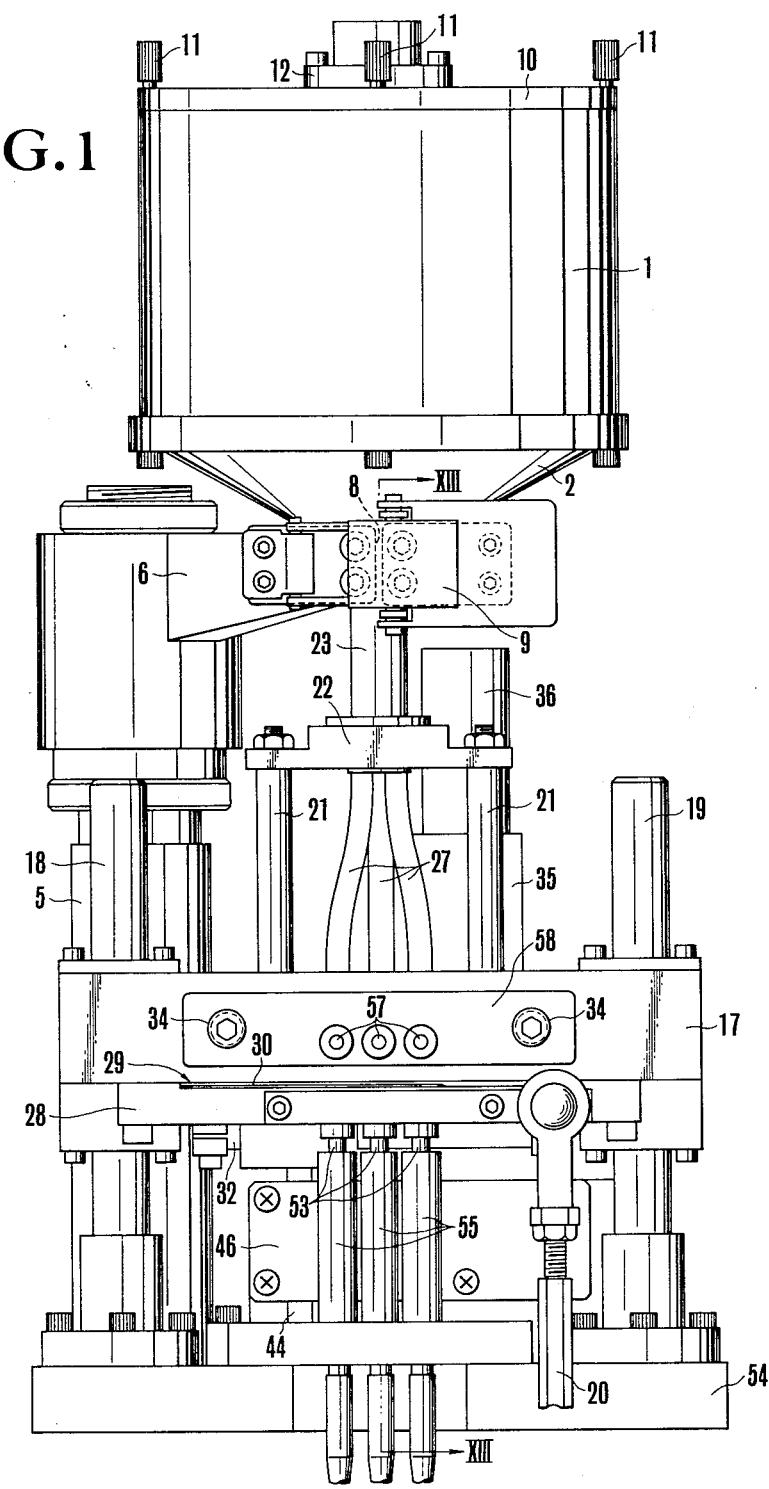
FIG. 1 is a front elevational view of an automatic feeding apparatus for producing hybrid integrated circuits according to the present invention.
Figure 2:
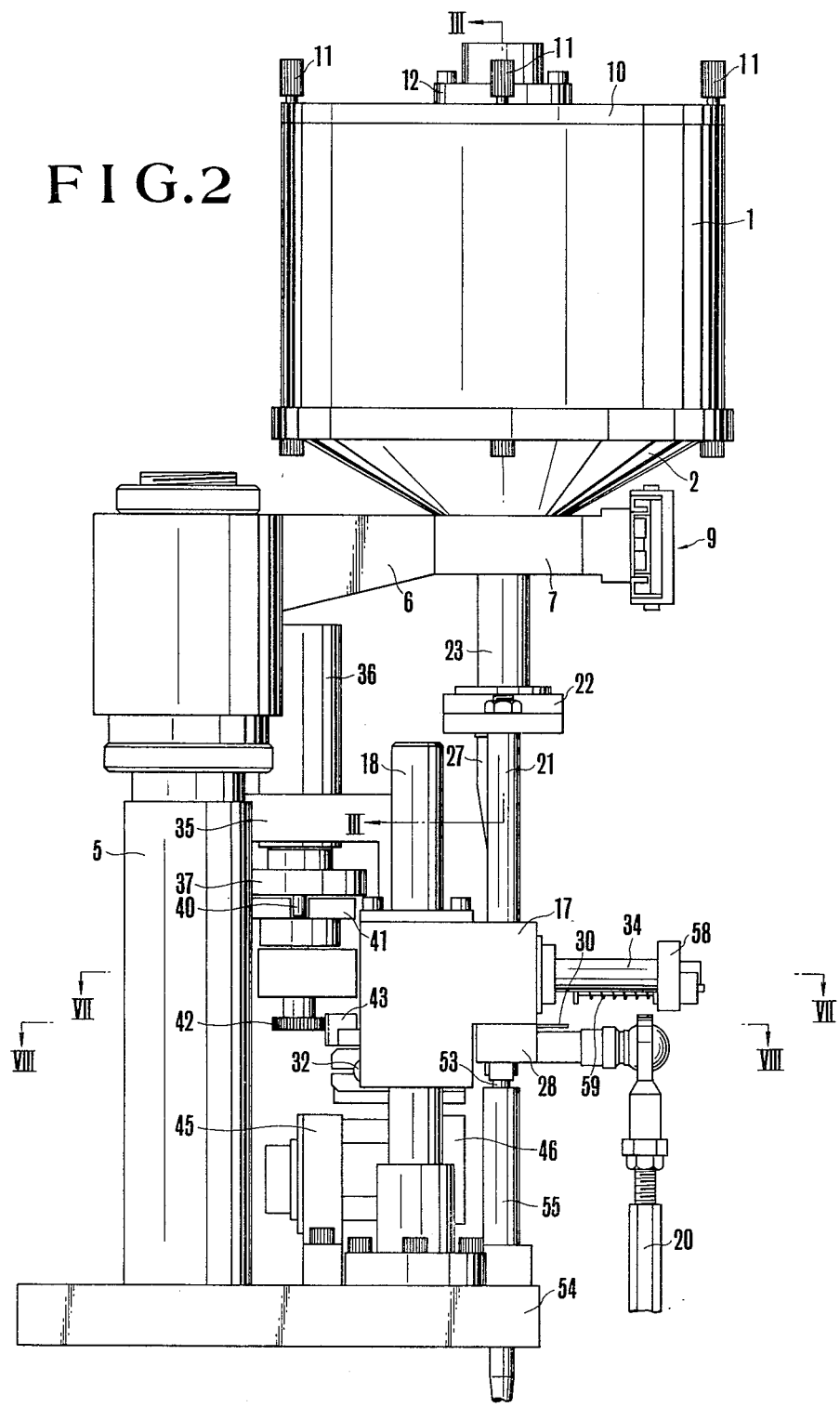
FIG. 2 is a side elevational view of the unit shown in FIG. 1.
Figure 3:
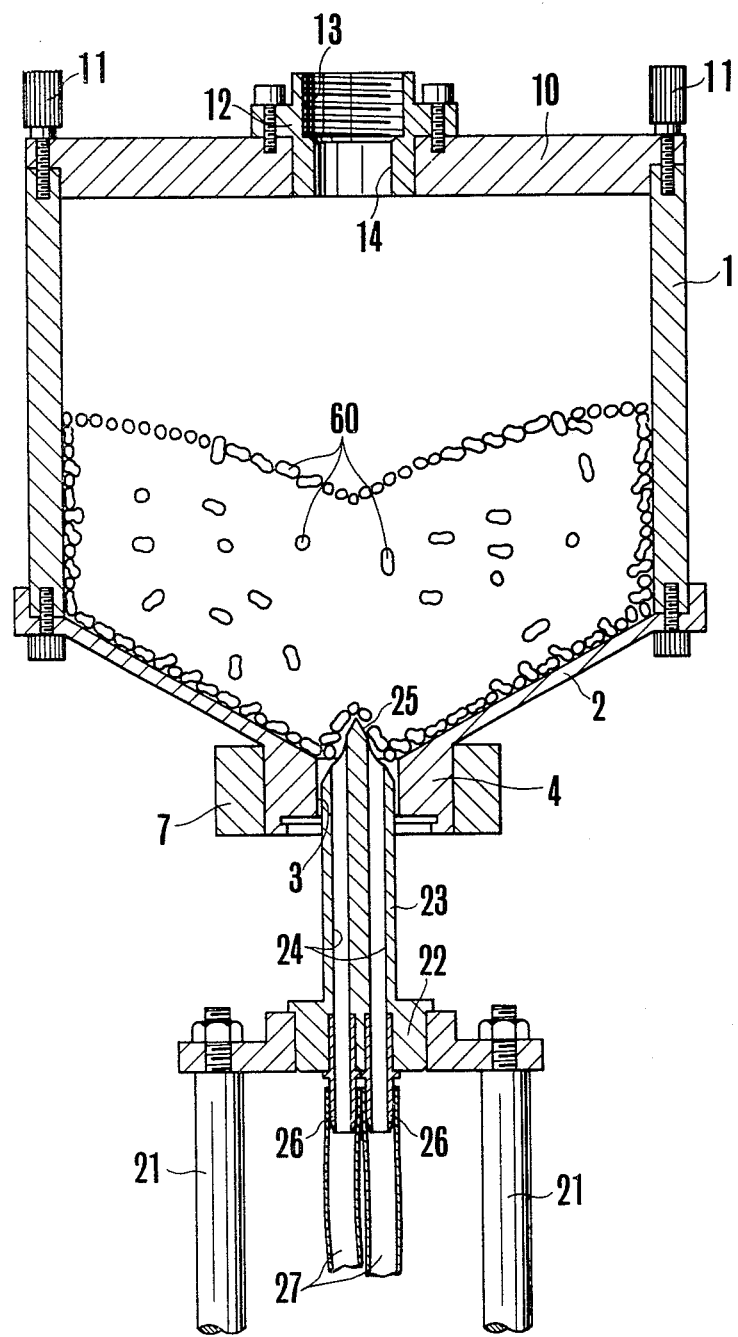
FIG. 3 is a sectional view taken along the line III—III of FIG. 2.

With reference now to the drawing and, initially to FIGS. 1 and 2, it is seen that the circuit element feeding apparatus of the present invention includes a cylindrical container or receptacle 1 made of a transparent plastic material which is adapted to hold a plurality of electric circuit parts. Container 1 is provided with a conical bottom plate 2 which includes a through bore 3 through a neck portion 4 at the center of the bottom plate 2, as shown in FIG. 3.

The apparatus further includes a stem support member 5 which has mounted in its upper end a supporting arm 6. Arm 6 includes a ring-shaped supporting portion 7 on its end which supports neck 4 of container 1. Ring-shaped supporting portion 7 includes a vertically extending slit 8 and is equipped with a clamp mechanism 9 to clamp neck 4 of container 1 to supporting portion 7 to securely hold container 1.

Figure 5:
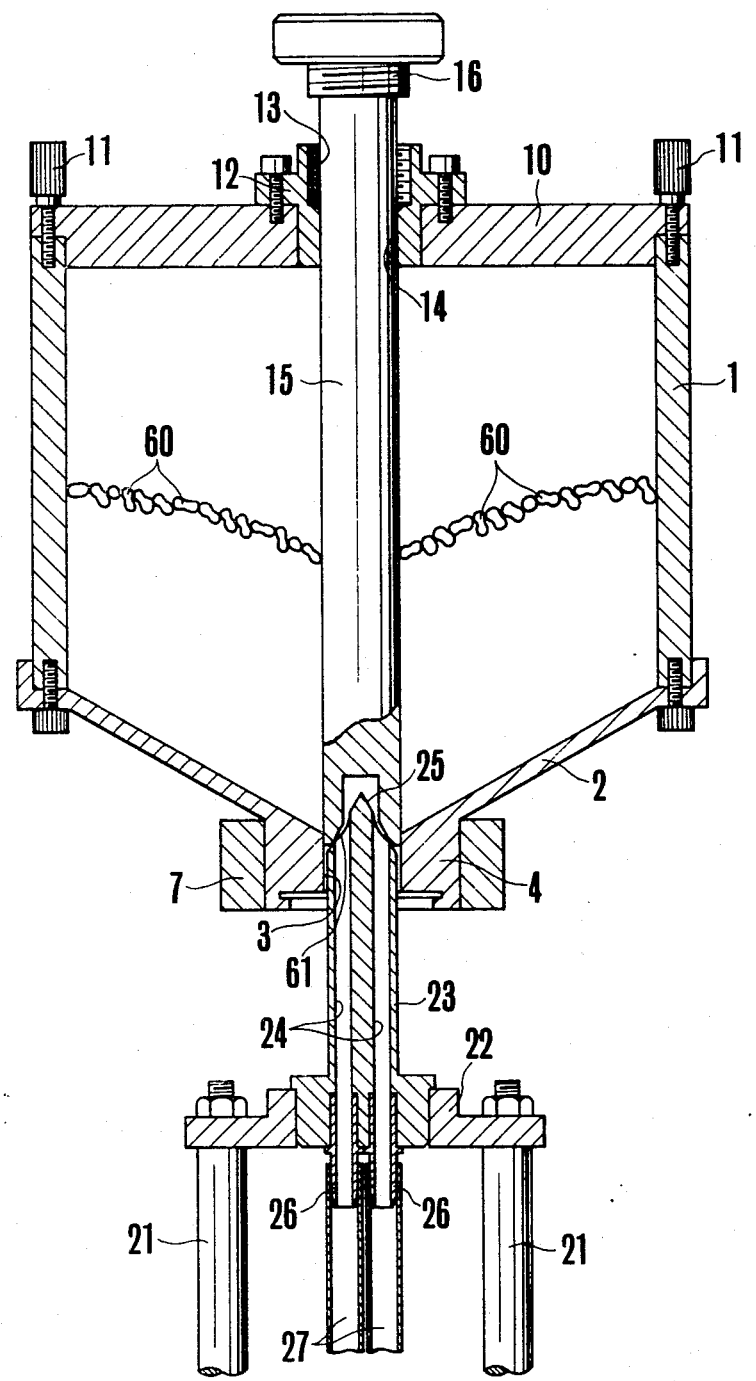
FIG. 5 is a sectional view similar to that in FIG. 3 illustrating the apparatus in another operating state.
Figure 6:
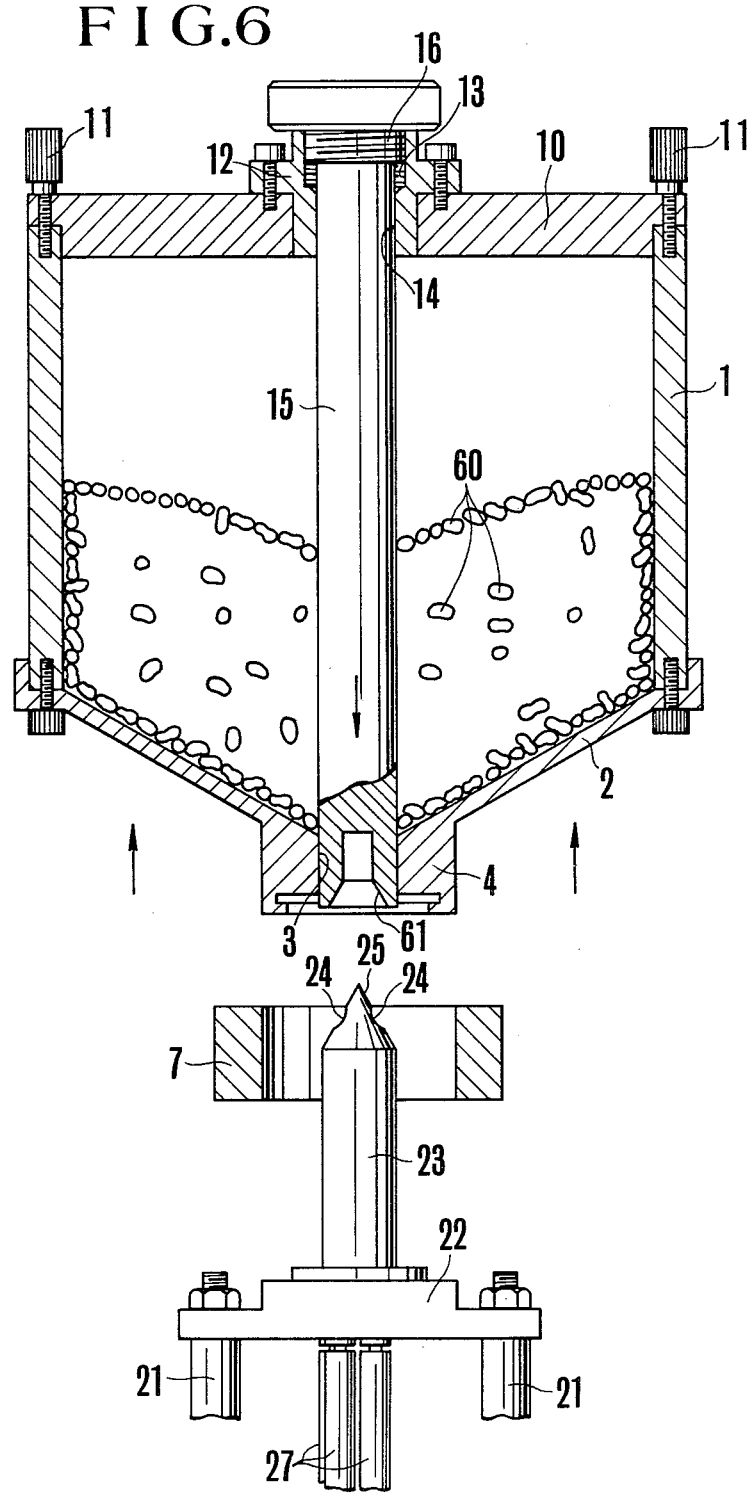
FIG. 6 is a sectional view similar to that of FIG. 3 illustrating the apparatus in still another operating state.

The upper end of container 1 is open and is covered by a disc-shaped cap 10 detachably secured thereto by means of screws 11. Cap 10 is provided with a sleeve 12 at its center and sleeve 12 is provided with a central threaded bore 13 leading into a smaller diameter through bore 14. Threaded bore 13 and through bore 14 are adapted to receive a plug shaft 15 (see FIG. 5) which is inserted into through bore 14 and engaged by screwing the male thread portion 16 on the shaft 15 to the female threaded bore 13. When so engaged, shaft 15 extends into through bore 3 of the container and closes off the bottom to permit the removal of the container 1, as shown in FIG. 6.

A movable block 17 is disposed beneath container 1 for reciprocal vertical movement along left and right vertical support members 18 and 19. Block 17 is vertically reciprocated as it is driven by an external driving source (not shown) through a link member 20. Movable block 17 includes a pair of upstanding stems 21 which have a support plate 22 secured to their upper ends.

A circuit element capture assembly 23 is mounted on support plate 22. Capture assembly 23 is adapted to successively capture the chip-type elements in container 1 and to deliver them to predetermined positions for assembly on an integrated circuit board. Capture assembly 23 is in a columnar form, as shown in FIG. 3, and is preferably made of a synthetic resin such as teflon. Capture assembly 23 has a conical end surface portion 25 provided with three axial bores 24, opening at their upper ends in the conical surface 25 of the capture assembly, and communicating at their lower ends with a connecting pipe 26 embedded in the capture assembly 23. Connecting pipe 26 is connected at its lower end to three tubes 27 made of teflon.

Figure 4:
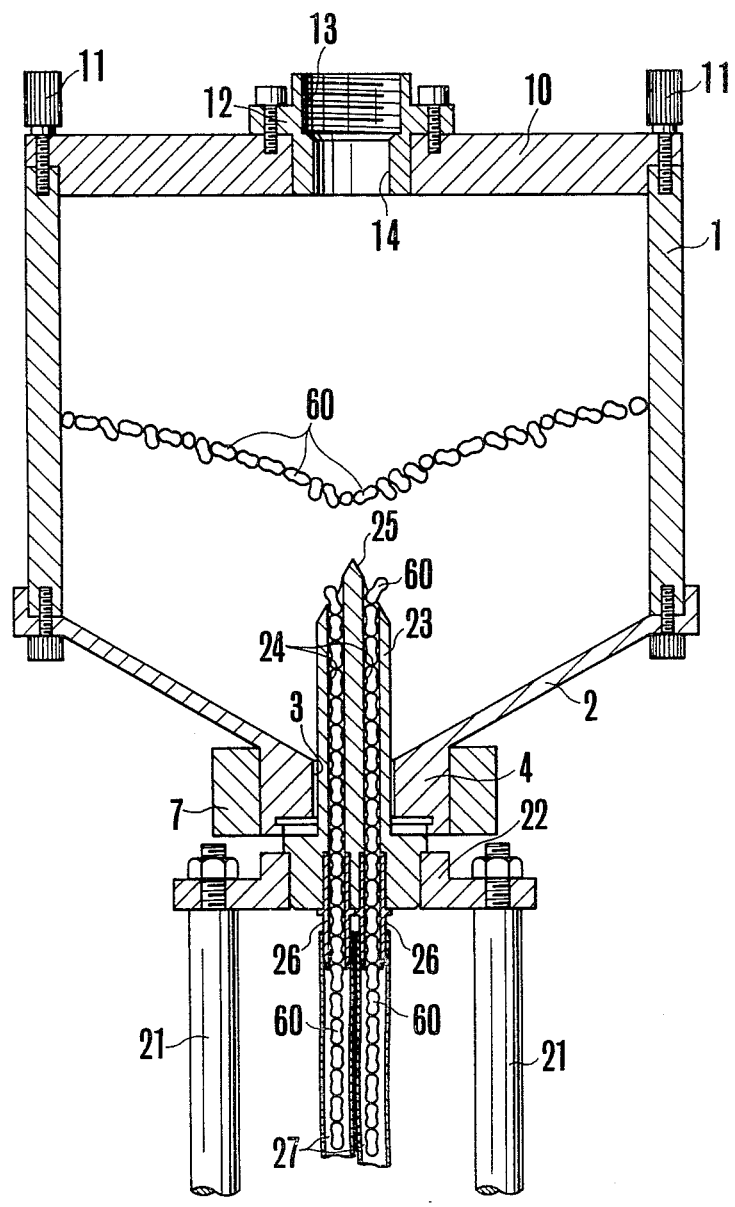
FIG. 4 is a sectional view similar to that in FIG. 3 which shows the apparatus in one operating state.

As is seen in FIGS. 3 and 4, capture assembly 23 is vertically reciprocated by the vertical reciprocating motion of movable block 17. During this vertical reciprocating movement capture assembly 23 slides up through bore 3 of neck 4 in container 1 and circuit elements within container 1 are captured within capture assembly 23 by means of the through bores 24 in the conical end surface 25. The captured elements are then delivered to predetermined positions. The end surface 25 of assembly 23 has a conical angle of, for example, 60° as viewed in the side elevation.

Figure 7:
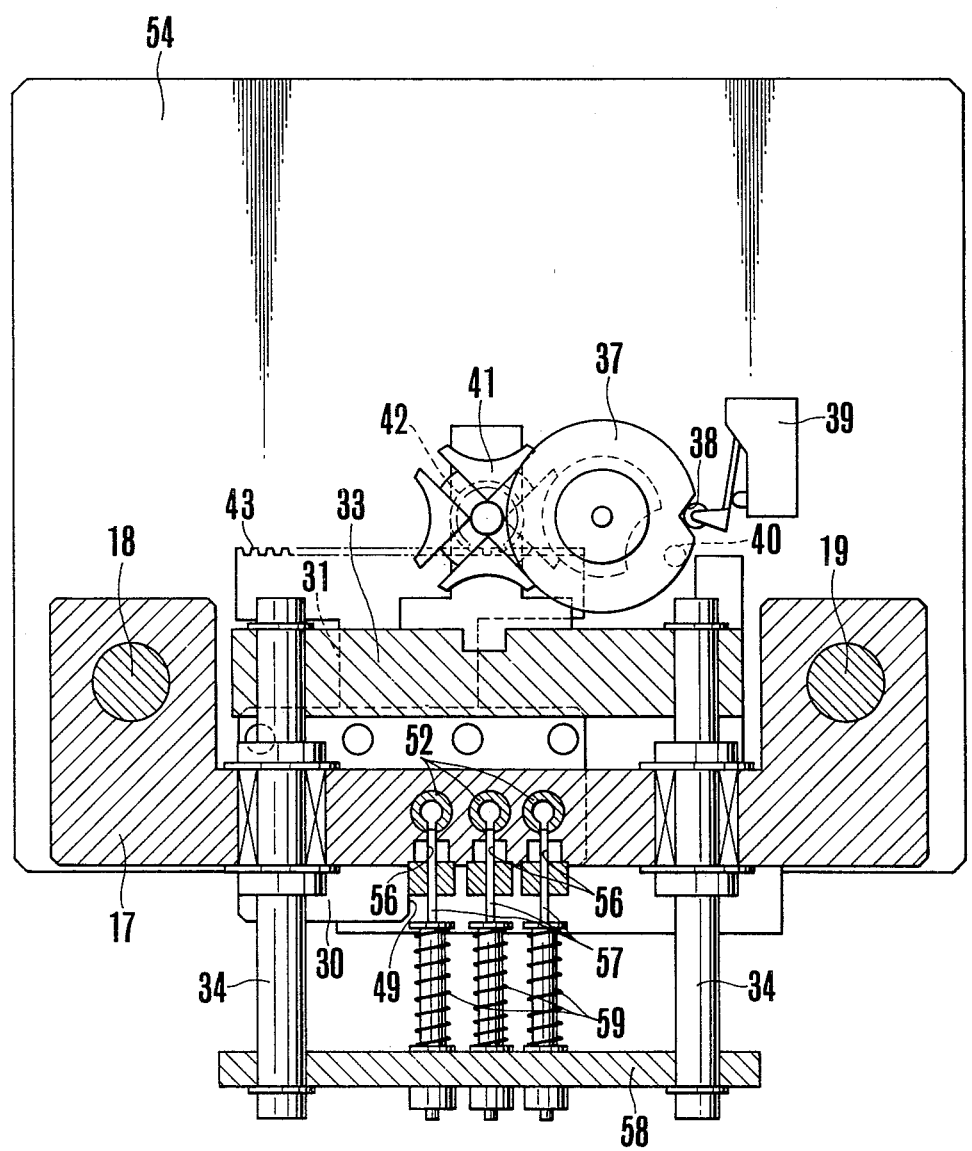
FIG. 7 is a sectional view taken along the line VII—VII of FIG. 2.
Figure 8:
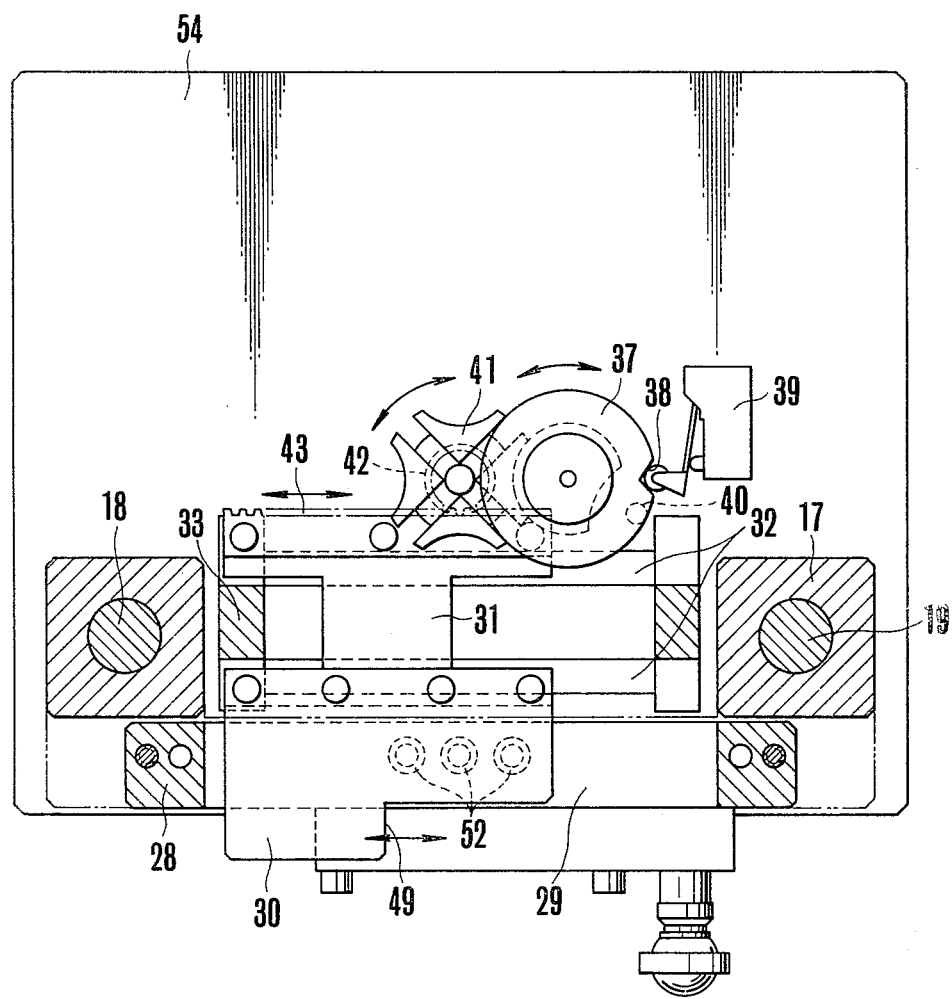
FIG. 8 is a sectional view taken along the line VIII—VIII of FIG. 2.

A description will now be provided of the shutter mechanism of the circuit element feeding apparatus. The shutter mechanism includes a guide plate 28 secured to the lower end of movable block 17 (See FIGS. 1 and 2). Guide plate 28 is provided with a recess 29 formed in its upper surface, i.e. the surface contacting block 17, so that a slit-like space is formed between guide plate 28 and block 17 and a shutter 30 is movably received within this space. As seen in FIG. 8, shutter 30 is fixed to a shutter supporting plate 31 which is disposed so as to be movable to the left and right, as viewed in FIG. 8, by a pair of rods 32 fixed to a block 33 which is movable in the horizontal direction. The horizontally movable block 33 is adapted to be moved up and down, as viewed in FIG. 7, and to the left and right, as viewed in FIG. 2, by a pair of rods 34 connected thereto.

Figure 13:
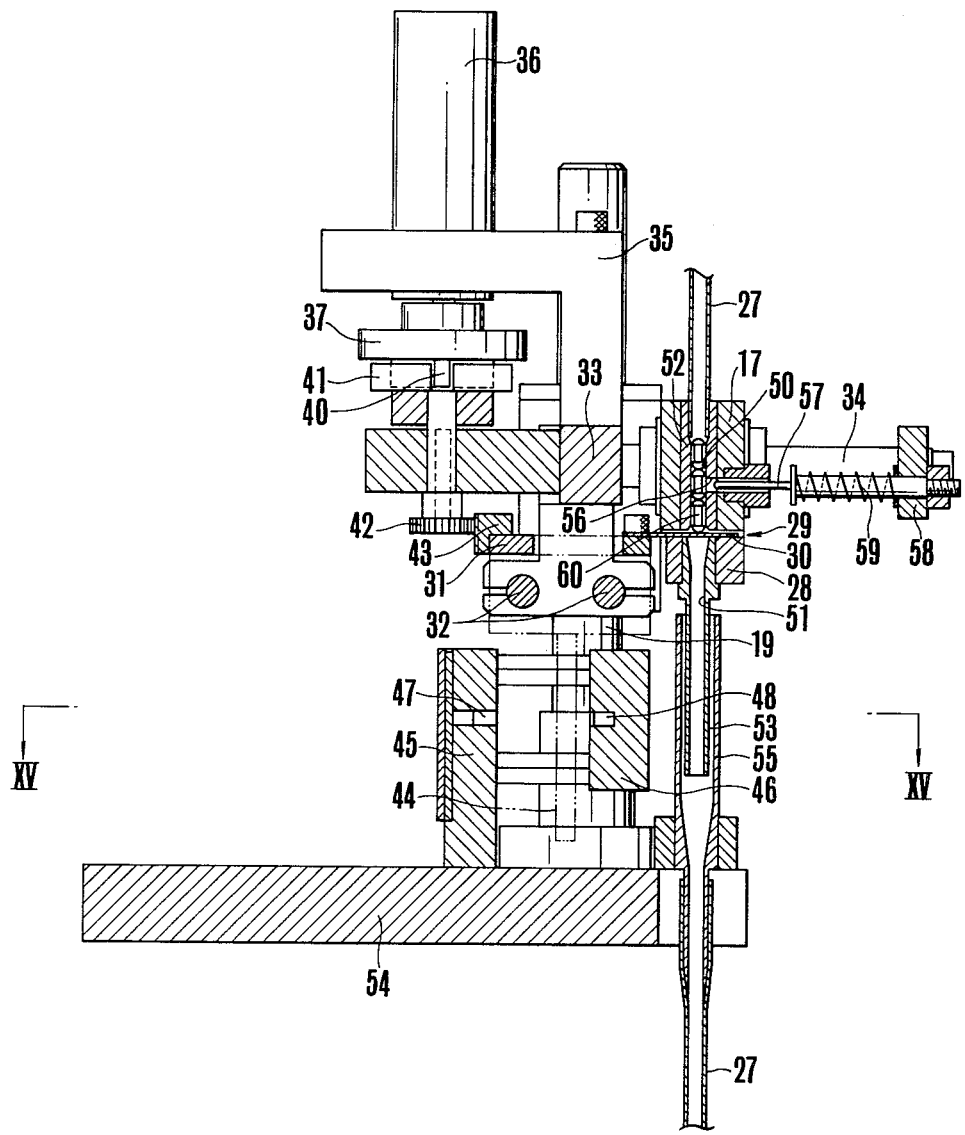
FIG. 13 is a sectional view taken along the line XIII—XIII of FIG. 1.

Horizontally movable block 33 is also provided with a supporting arm 35 formed integral therewith, as shown in FIG. 13, and a motor 36 is supported on horizontally movable block 33 on arm 35. Motor 36 has a built-in reduction gear to provide a reduced speed for the motor output shaft which has a cam 37 fixed thereon. A substantially triangular recess 38 is formed in cam 37, (FIGS. 7 and 8) and an operating portion of a microswitch member 39 is received within triangular recess 38. A pin 40 is mounted on the lower face of the cam 37 and is adapted to be engaged by radial grooves of a Geneva gear 41 to rotate the latter intermittently by 90° in each operation. The Geneva gear 41 is rotatably mounted on the horizontally movable block 33 and is fixed to a pinion 42 which in turn is in engagement with a rack 43 fixed to the end of shutter supporting plate 31. Therefore, as the motor 36 is driven, shutter supporting plate 31 is moved to the left and right, as viewed in FIG. 8, guided by rods 32, through Geneva gear 41, pinion 42 and rack 43.

Figure 15:
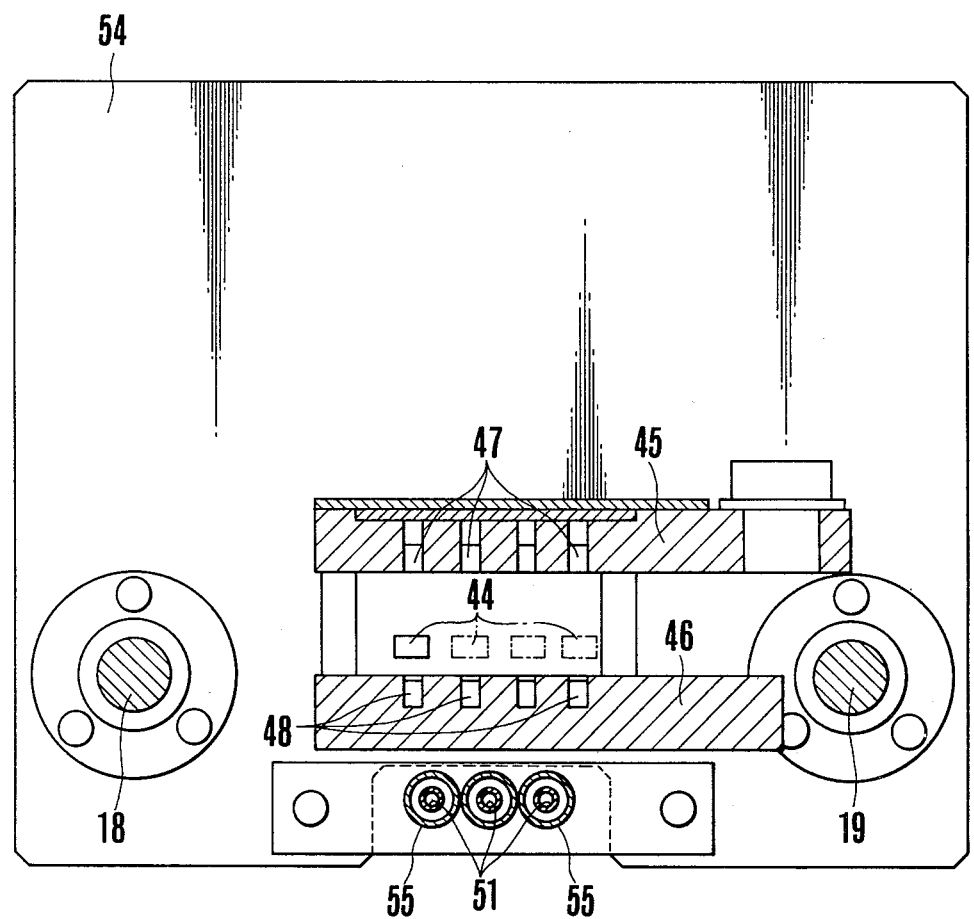
FIG. 15 is a sectional view taken along the line XV—XV of FIG. 13.

The movement of the shutter supporting plate 31 is detected by an optical detecting means which is shown in FIG. 13. The optical detecting means includes downwardly extending black-colored light-shielding rods 44 fixed to the lower surface of shutter supporting plate 31. As is also seen in FIG. 15, light-shielding rods 44 extend to a space between supporting plates 45 and 46. The arrangement is such that the position of the shutter supporting plate 31 is detected by photosensitive elements 48 carried by one supporting plate 46 as the light emitted from light-emitting elements 47 mounted on supporting plate 45 is shielded by the shielding rods 44.

As seen in FIG. 8, shutter 30, which is preferably made of stainless steel plate, is provided at its front end with an L-shaped notch 49. The arrangement is such that the number of circuit elements fed in each stroke is adjusted by means of notch 49. As best seen in FIG. 13, shutter 30 is disposed between three circuit element passage bores 50 formed in movable block 17 and three circuit element passage bores 51 formed in guide plate 28 so as to selectively interrupt the communication between these passages. The element passage bores 50 are formed in movable block 17, preferably made of steel, and a sleeve 52 of a non-magnetic material such as phosphrous bronze is fitted in each bore. This arrangement precludes any magnetic interference between the passage and the cap portions and the electrodes at either end of the chip-type circuit elements. One of each of the aforementioned tubes 27 is connected to the upper end of each circuit element passage bore 50 and circuit element passage bores 51 in guide plate 28 are constituted by pipes 53 fixed to the through bore within guide plate 28 with each pipe 53 being received at its lower end within a connection pipe 55 fixed to a base plate 54.

Each of the three circuit element passage bores 50 is provided with a small hole 56 which intersects the bore 50 at a right angle. A pin 57 is received within small hole 56. Each pin 57 is slidably supported by a connecting plate 58 which in turn is carried by the ends of rods 34 and plate 58 is resiliently biased by means of coiled springs 59 which act at one end on the connecting plate 58. Due to this biasing force each pin 57 holds a circuit element in a respective passage bore 50 and this is the element which rests on the element directly carried by the shutter. Therefore, only the circuit element just on the shutter is allowed to drop even when the shutter is opened.

In operation the apparatus of the present invention functions in the following manner. As shown in FIG. 3, a plurality of preselected chip-type circuit elements 60 are placed in container 1. Typically each of these elements has a cylindrical form and is of a predetermined size. The charging of container 1 with the circuit elements 60 is performed by removing the cap 10 and placing the elements in container 1.

As is seen in FIGS. 3 and 4, capture assembly 23 passing through bore 3 at the container bottom is moved up and down relative to container 1. This movement is achieved by driving movable block 17 up and down rods 18 and 19 by the driving source (not shown). With this reciprocal motion capture assembly 23 is moved through the group of circuit elements 60 stored in container 1. The chip-type elements 60 are captured by the three through bores 24 within the conical surface 25 of capture assembly 23 so as to fill each through bore 24 with a number of elements 60, as illustrated in FIG. 4.

The circuit elements 60 held in through bores 24 keep a uniform upright posture to facilitate the subsequent movement of these parts. In addition, since capture assembly 23 moves along the axis of container 1 only these circuit elements 60 which are disposed along the axis line of all the elements stored in container 1 are moved to preclude unwanted movement of these elements and, accordingly, minimize the chance of damaging them.

In addition, since the arrangement in the present invention is such that the circuit elements 60 are taken out of container 1 by the movement of capture assembly 23 the feeding apparatus of this invention operates conveniently with a reduced level of vibration and noise as compared with conventional vibration-type feeding apparatus.

Moreover, since circuit elements 60 are not transferred by vibration the circuit element caps and extending electrodes at each end of the circuit elements 60 are not subject to vibration and collision so that any chance of damage is reduced to ensure a good electrical connection and, hence, proper operation of the completed electrical circuit.

In replacing the type of circuit elements 60 in container 1, for example to comply with a change of circuit element type dictated by the requirements for a particular printed circuit board, it is evident that it would be inconvenient to take out all elements 60 from container 1. Therefore, in the apparatus of the present invention, an arrangement is made to permit the replacement of container 1 as a whole. More specifically, to replace the circuit elements 60, plug shaft 15 is inserted into container 1 through bore 14 of cap 10 and threaded therein as shown in FIG. 5. Thus plug shaft 15 closes the lower end of container 1 so that plug shaft 15 is coupled to container 1 while completely closing through bore 3. When so positioned a conical recess 61 formed at the lower end of plug shaft 15 fits over the conical end of capture assembly 23 and prevents further feeding of any circuit elements. Clamp mechanism 9 is then loosened and container 1 is removed gently in the axial direction thereby to release container 1 from the clamp mechanism 9.

After removing a container 1 from the circuit element feeding apparatus in the above-described manner, another like container containing different circuit elements 60 is mounted on the feeding apparatus substantially in the reverse manner to the container removing operation. After withdrawal of plug shaft 15 new container 1 is supported by supporting portion 7 of supporting arm 6 and clamp mechanism 9 is tightened to clamp and fix the new container 1 containing the desired circuit elements 60. It is seen that the replacement of the circuit elements can be made without fail and without dropping the chip-type elements 60 from the container through the use of plug shaft 15. The replacement of elements is greatly facilitated if a multiplicity of containers containing different circuit elements are prepared. Thus it is not necessary to unload and load the containers with different types of circuit elements.

Figure 11:
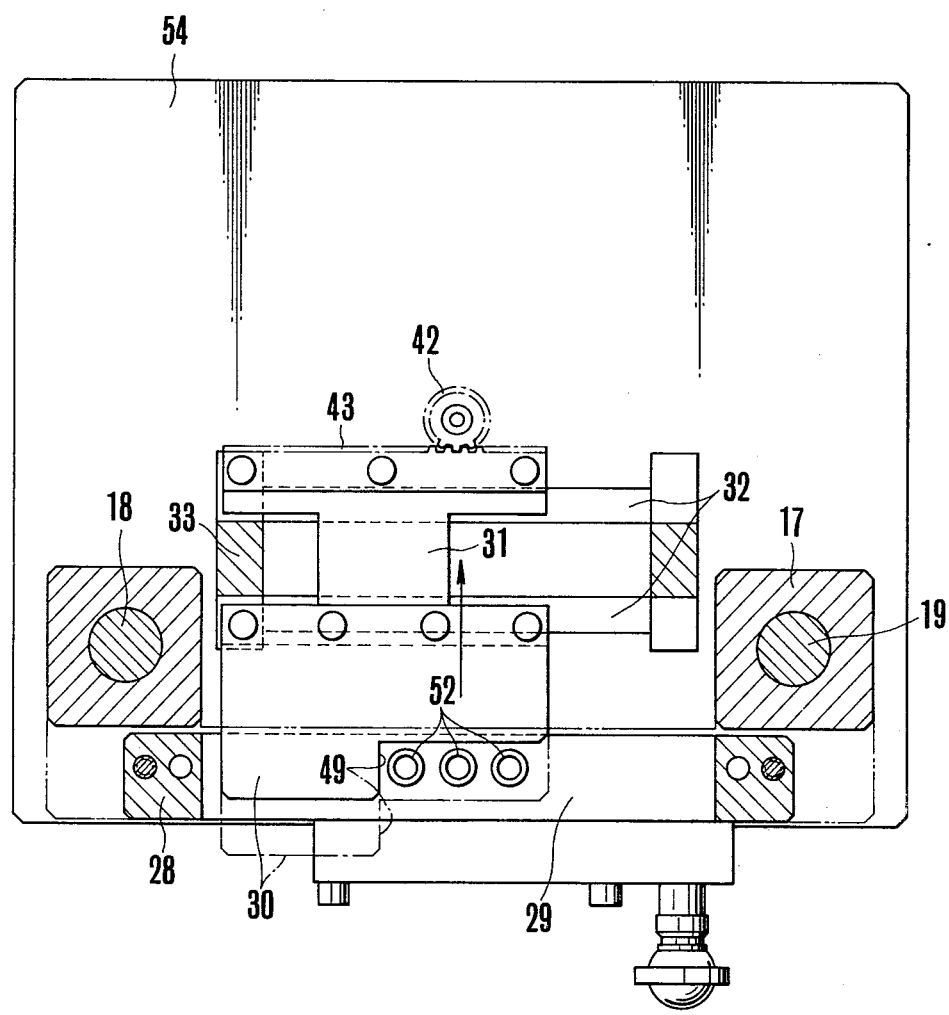
FIG. 11 is a sectional view similar to that in FIG. 8 showing the operating state in which the shutter is kept opened.

In operation, circuit elements 60 are taken out of container 1 by capture assembly 23 and are moved to the position of the shutter mechanism by gravitational force while being guided by tube 27. These elements are successively transferred to the next step of the operation by the opening and closing operation of shutter 30. In this operation, horizontally movable block 33 is driven by a driving means (not shown) to move in the horizontal direction with respect to movable block 17 since rods 34, fixed to horizontally movable block 33, are guided and supported for free sliding movement relative to block 17. Since horizontally movable block 33 carries shutter supporting plate 31 through the pair of rods 32, the movement of horizontally movable block 33 in the axial direction of rods 34, i.e. in the upward direction as viewed in FIG. 7, causes an upward movement of shutter supporting plate 31, as shown in FIG. 11.

As a consequence, the edge of shutter 30, carried by shutter supporting plate 31, is moved out of the position corresponding to the element passage bore 50 so that the three element passage bores 50 and three element passage bores 51 are allowed to communicate with each other. The three passage bores 50 are placed in communication with the three passage bores 24 of capture assembly 23. Therefore, the elements introduced into the passage bores 50 by the capture assembly 23 are free to drop into the corresponding element passage bores 51.

Figure 14:
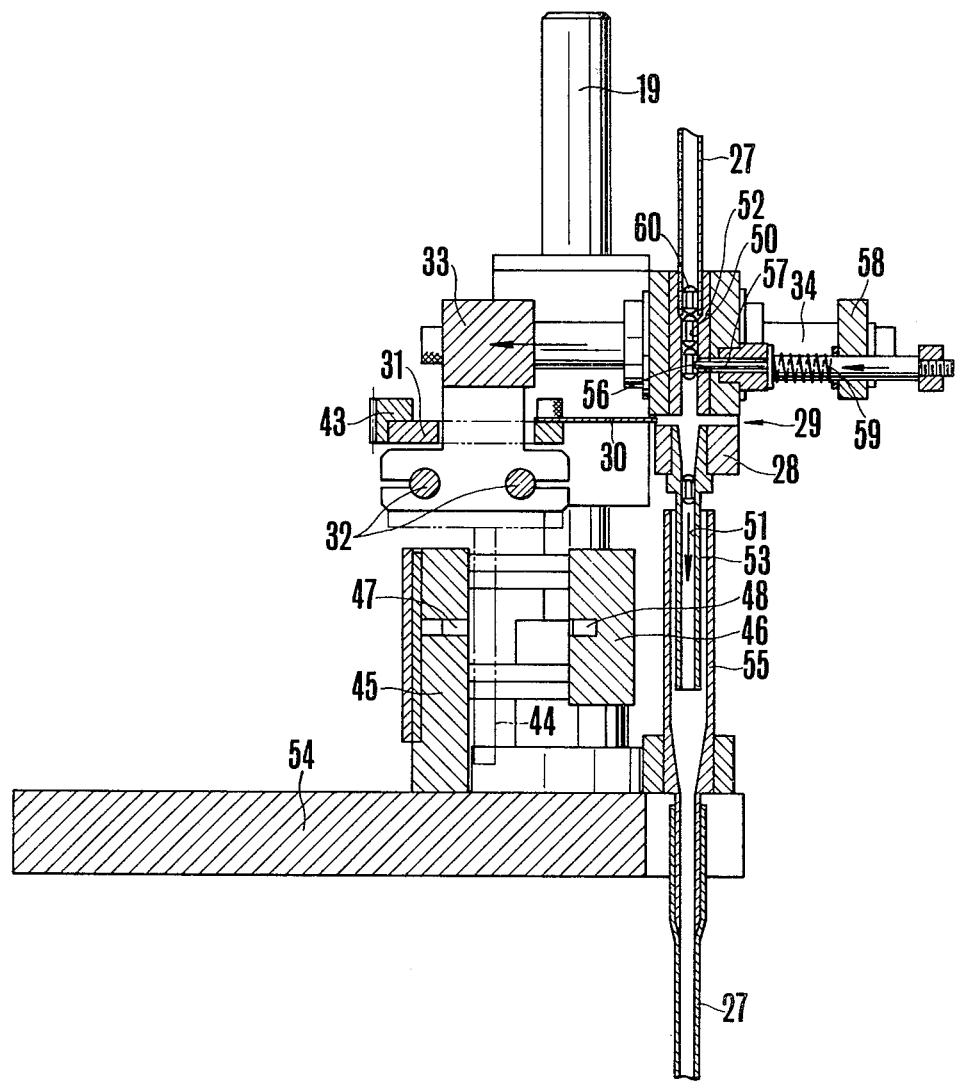
FIG. 14 is a sectional view similar to that in FIG. 13 showing the operating state in which the second element from the hopper is held.

This arrangement is such that each element passage bore 50 delivers only one element 60 when shutter 30 is opened. Thus, as horizontally movable block 33 is moved to open shutter 30 the connecting plate 58 connected to the ends of rods 34 fixed to the block 33 is moved to the left, as viewed in FIG. 14 so as to compress the coiled spring 59. As a result, pin 57 is moved to the left by the resilient biasing force of spring 59 to press an element 60, which is immediately above element 60 just on shutter 30, against the wall of the passage bore 50. Thus, the second and following elements 60 are prevented from dropping on shutter 30 so that only one circuit element 60 is dropped into the element passage bore 51.

Figure 9:
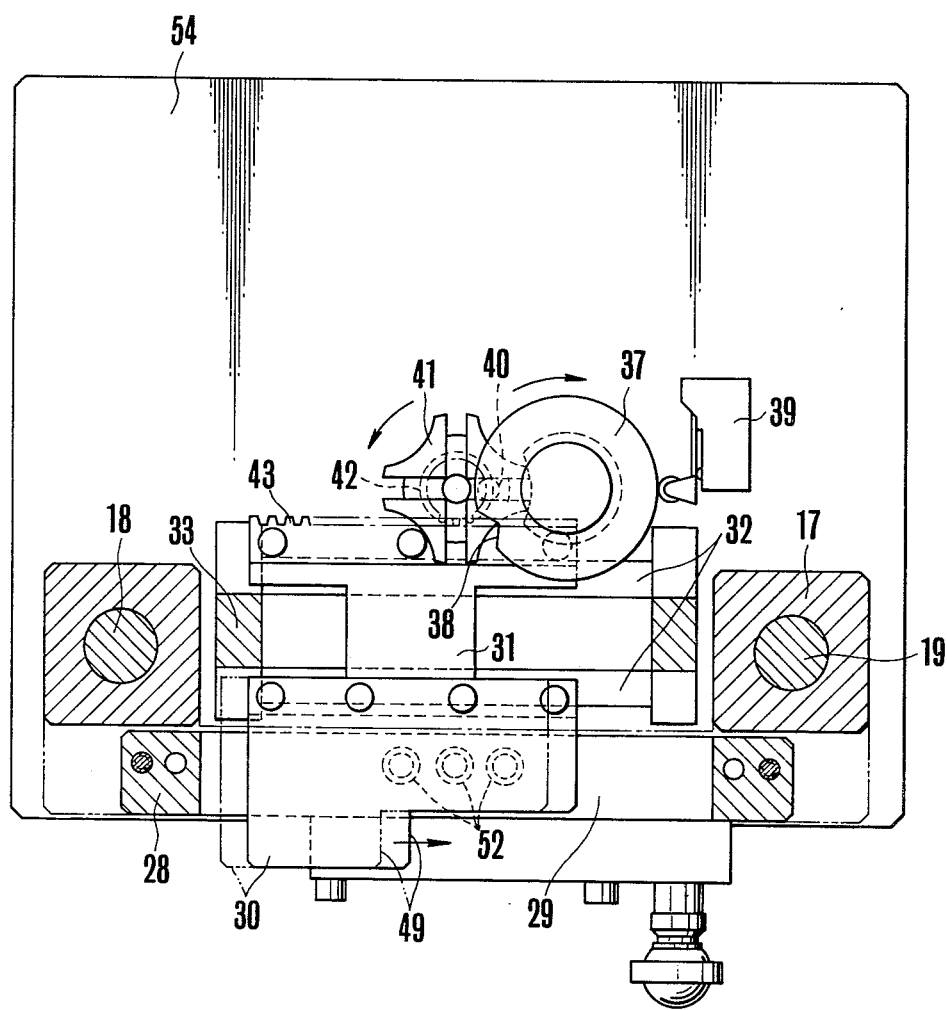
FIG. 9 is a sectional view similar to FIG. 8 illustrating the apparatus during the operation for adjusting the quantity of feed by shifting the position of a shutter.

The number of circuit elements fed at one time by a single stroke of shutter 30 can be varied, as desired, within the range of between zero and three. More specifically, motor 36 is started when the apparatus is in the state shown in FIG. 8 so that Geneva gear 41 is rotated in the manner shown in FIG. 9 by means of cam 37 and the pin 40. A 90° rotation of Geneva gear 41 moves shutter supporting plate 31 in the lengthwise direction of rods 32 through the action of pinion 42 and rack 43 by a distance corresponding to one pitch of the element passage bores 50 and 51 into the operating state shown in FIG. 10.

Figure 12:
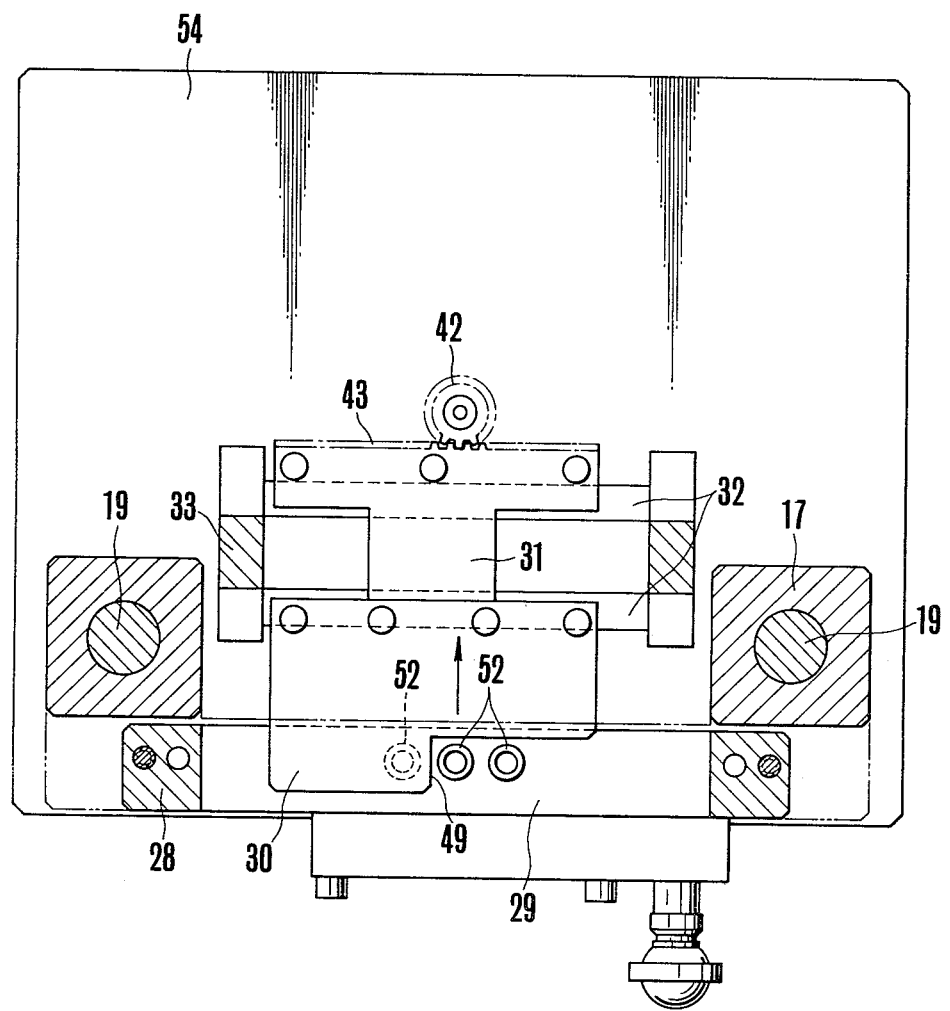
FIG. 12 is a sectional view similar to that in FIG. 8 showing the operating state in which a shutter for supplying two elements are kept in the opened state.

Since shutter 30 includes an L-shaped notch 49, only two sets of the element passages 50 and 51 out of the three are allowed to communicate with each other when shutter 30 is moved by the horizontally movable block 33 in the opening direction, i.e. in the upward direction as viewed in FIG. 12.As a result, two circuit elements 60 are fed by a single stroke of shutter 30.

The shifting of the position of shutter 30 for controlling the number of the circuit elements to be fed is achieved by driving Geneva gear 41 by means of motor 36. The displacement of shutter 30 is precisely detected as the light shielding rod 44 shields the light emitted from the corresponding light-emitting element 47 and, therefore, the shutter is stopped precisely at the predetermined position. The Geneva gear 41 makes a 90° rotation as cam 37 makes one full rotation and the completion of one full rotation of the cam is detected by a cooperation of the recess 38 of the cam 37 and the microswitch 39.

As the Geneva gear 41 is further rotated by 90°, so as to shift the position of shutter 30 to the position shown by the single dot-dash line in FIG. 10, the number of elements delivered by one stroke of the shutter from the feeding unit is reduced to one. A further 90° rotation of the Geneva gear 41 by the motor causes L-shaped notch 49 of shutter 30 to move to the position on the right side of the right element passage bore 51, as shown by the double dot-dash line in FIG. 10. In this state, no circuit element 60 is delivered even when shutter 30 is moved to the open position. Thus, the number of elements delivered from the unit in this state is zero.

While this invention is illustrated with specific embodiments, it will be recognized by those skilled in the art that modifications may be made therewith without departing from the true scope of the invention as defined by the following claims.

What is claimed is:

1. An apparatus for automatically feeding electrical circuit elements for assembly on an integrated circuit board comprising:
    a container for storing a plurality of electrical circuit elements,
    transfer means operatively associated with said container for transferring a number of said electrical circuit elements from said container to an integrated circuit board, said transfer means including a plurality of circuit element transfer members for receiving said electrical circuit elements from said container, and
    shutter means movable in a path across the path of said transfer means between a first position for receiving a predetermined number of electrical circuit elements from said circuit element transfer members and preventing passage of said predetermined number of said elements to the circuit board and a second position for passing a selectively variable number of said electrical circuit elements through said shutter means for assembly on an integrated circuit board, wherein said selectively variable number is determined by a shutter member movable with said shutter means for preventing passage of some of said predetermined number of said electrical circuit elements through said shutter member when said shutter means is in said second position.

2. An apparatus for automatically feeding electrical circuit elements according to claim 1, wherein:
    said transfer members deliver said electrical circuit elements to said shutter means in side-by-side relation, and
    said shutter means includes a notched portion for movement into register with a selectively variable number of said transfer members for allowing passage into respective transfer passages of the electrical circuit elements in said selected transfer members.

3. An apparatus for automatically feeding electric circuit elements according to claim 2 wherein said shutter means includes means for adjustably orienting said notched portion of said shutter means as said shutter means moves across said transfer members to selectively deliver an electrical circuit element from selected ones of said transfer members to said respective transfer passages.

4. An apparatus for automatically feeding electric circuit elements according to claim 3 wherein said means for adjustably orienting said notched portion of said shutter means includes an intermittent driving mechanism adapted to bring said notched portion of said shutter means selectively to positions in register with said transfer passages thereby to permit an electrical circuit element to move from said transfer member through said shutter means to said transfer passage.

5. An apparatus for automatically feeding electrical circuit elements according to claim 2 wherein said shutter means includes a shutter plate including a notched portion thereon, said shutter plate is movable from said first position wherein said plate is positioned over said transfer passages to preclude movement of said electrical circuit elements into said transfer passages to said second position wherein said notched portion is over said transfer passages to allow movement of said circuit elements from said transfer members into said transfer passages, and said shutter means further includes holding means carried by said shutter plate to hold an electrical circuit element in each said transfer member immediately above the bottommost circuit element therein when said shutter plate is in said first position and operable to release said held electrical circuit element when said shutter plate moves to said second position.

6. An apparatus for automatically feeding electrical circuit elements according to claim 1 wherein said container includes a bottom through bore therein for passage of said electrical circuit elements therethrough, said apparatus further comprising an electrical circuit element capture assembly adapted to slidingly fit within said container through bore, said capture assembly including at least one axial through bore therein in communication with said transfer means and wherein said capture assembly is reciprocatably movable relative to said container to capture electrical circuit elements in said container for delivery to said transfer means.

7. An apparatus for automatically feeding electrical circuit elements according to claim 6 wherein said capture assembly has a conical end portion and said capture assembly axial through bore is positioned in said conical end surface.

8. An apparatus for automatically feeding electrical circuit elements according to claim 6 wherein said capture assembly includes a plurality of axial through bores therethrough.

9. An apparatus for automatically feeding electrical circuit elements according to claim 6 further comprising a shaft-shaped closure means adapted to be inserted into a bore formed on a cap of said container and into abutment with said container through bore to keep the bottom through bore of said container closed thereby to permit removal of said container without loss of electrical circuit elements through the container through bore.

* * * * *